US007586238B2

(12) United States Patent
Liu

(10) Patent No.: US 7,586,238 B2
(45) Date of Patent: Sep. 8, 2009

(54) CONTROL AND TESTING OF A MICRO ELECTROMECHANICAL SWITCH HAVING A PIEZO ELEMENT

(75) Inventor: Lianjun Liu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 266 days.

(21) Appl. No.: 11/465,319

(22) Filed: Aug. 17, 2006

(65) Prior Publication Data

US 2008/0042518 A1 Feb. 21, 2008

(51) Int. Cl.
*H01L 41/04* (2006.01)
*H01H 57/00* (2006.01)

(52) U.S. Cl. ........................ 310/328; 310/309; 310/330

(58) Field of Classification Search ................. 310/309, 310/319, 324, 328, 330–332, 338; 200/181
See application file for complete search history.

(56) References Cited

U.S. PATENT DOCUMENTS

| | | | | |
|---|---|---|---|---|
| 3,247,711 | A * | 4/1966 | Howatt | 73/862.53 |
| 4,939,401 | A * | 7/1990 | Farrall | 310/317 |
| 5,578,976 | A | 11/1996 | Yao | |
| 6,307,169 | B1 | 10/2001 | Sun et al. | |
| 6,307,452 | B1 | 10/2001 | Sun | |
| 6,384,353 | B1 | 5/2002 | Huang et al. | |
| 6,479,920 | B1 * | 11/2002 | Lal et al. | 310/309 |
| 6,507,475 | B1 | 1/2003 | Sun | |
| 6,549,570 | B1 * | 4/2003 | Moden et al. | 375/224 |
| 6,706,548 | B2 | 3/2004 | Liu | |
| 6,713,942 | B2 * | 3/2004 | Raman et al. | 310/316.01 |
| 6,744,264 | B2 | 6/2004 | Gogoi et al. | |
| 6,794,101 | B2 | 9/2004 | Liu et al. | |
| 7,301,254 | B1 * | 11/2007 | Lal et al. | 310/309 |
| 2004/0070400 | A1 | 4/2004 | van Spengen | |
| 2005/0127792 | A1 * | 6/2005 | Mehta | 310/332 |

OTHER PUBLICATIONS

Sood et al; "Piezoelectric Micro power Generator for Energy Harvesting"; Department of Mechanical Engineering, Massachusetts Institute of Technology, Cambridge, MA.

Li et al; "Vibration Control of a PZT Actuated Suspension Dual-Stage Servo System Using a PZT Sensor"; IEEE Transactions on Magnetics, vol. 39, No. 2, Mar. 2003.

* cited by examiner

*Primary Examiner*—Quyen Leung
*Assistant Examiner*—Derek J Rosenau
(74) *Attorney, Agent, or Firm*—Daniel D. Hill

(57) ABSTRACT

A micro electromechanical switch has a movable portion positioned to form an electrical connection between a first electrical contact and a second electrical contact. A piezoelectric electrode is formed on the movable portion. The piezoelectric electrode causes the movable portion to move in response to a driver voltage. A piezo element is formed on the movable portion of the switch. The piezo element is for detecting movement of the movable portion between an open position and a closed position. The piezo element is also used to detect switch bouncing when the switch transitions from the open position to the closed position. In one embodiment, the piezo element is a piezoelectric element and in another embodiment the piezo element is a piezo-resistive element.

20 Claims, 7 Drawing Sheets

CONTROL AND TESTING OF A MICRO ELECTROMECHANICAL SWITCH HAVING A PIEZO ELEMENT

CROSS-REFERENCE TO RELATED APPLICATIONS

The present application is related to a commonly assigned, co-pending application by Lianjun Liu et al. entitled, "Control and Testing of a Micro Electromechanical Switch,", and filed concurrently herewith.

The present application is related to a commonly assigned, co-pending application by Lianjun Liu entitled, "Piezoelectric MEMS Switches and Method For Making", having application Ser. No. 11/363,791, and filed on Feb. 28, 2006.

FIELD OF THE INVENTION

The present invention relates generally to micro electromechanical systems (MEMS), and more particularly, to sensing, control and testing of a MEMS switch having a piezo element.

RELATED ART

Micro electromechanical switches can be used in telecommunications systems to switch radio frequency (RF) signals. It is important for the MEMS switches to function reliably. A MEMS switch may fail closed, for example, due to stiction. A micro electromechanical switch may be used to couple a RF transmitter and a receiver to an antenna. A first switch is used to couple the receiver to the antenna while a second switch is used to coupled the transmitter to the antenna. Generally only the transmitter or the receiver can be coupled to the antenna at one time. If the first switch between the receiver and the antenna failed in the closed position when the second switch is closed, RF power from the transmitter may be fed into the receiver, causing serious damage. Therefore, it would be desirable to be able to detect when a MEMS switch fails to operate.

Also, when closing a MEMS switch, the switch may bounce between open and closed positions several times before closing completely. Switch bounce results in increased closing time and decreased reliability of the switch. Therefore, it would be desirable to reduce bouncing of a MEMS switch.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the disclosure.

DETAILED DESCRIPTION OF THE DRAWINGS

Generally, the present invention provides a micro electromechanical device having a micro electromechanical switch. The micro electromechanical switch has a movable portion positioned to form an electrical connection between a first electrical contact and a second electrical contact. A piezoelectric electrode is formed on the movable portion. The piezoelectric electrode moves the movable portion in response to a driver voltage. A piezo element is formed on the movable portion of the switch. The piezo element is for detecting movement of the movable portion between an open position and a closed position. The piezo element is also used to detect switch bouncing when the switch transitions from the open position to the closed position.

In one embodiment, the piezo element is a piezoelectric element that generates a voltage in response to a mechanical stress caused by movement of the movable portion. In another embodiment, the piezo element is a piezo-resistive element that changes resistance in response to a mechanical stress caused by movement of the movable portion.

In another aspect of the disclosed embodiments, a method for controlling a micro electromechanical switch is provided. The micro electromechanical switch has a movable portion positioned to form an electrical connection between a first electrical contact and a second electrical contact. A piezoelectric electrode is formed on the movable portion. The piezoelectric electrode moves the movable portion in response to a driver voltage. The method comprises: providing a piezo element on the movable portion to detect movement of the movable portion; providing the driver voltage to close the switch; detecting movement of the movable portion using the piezo element to determine if the switch is closed; and determining that the switch is closed.

Also, in another aspect of the above method, detecting movement of the movable portion further comprises: detecting switch bounce movements of the movable portion using the piezo element; and applying the driver voltage to counter the switch bounce movements.

By using a piezo element to sense whether the switch is open or closed, failure of the switch can be discovered. Also, the piezo element can be used to "self-test" the switch during power-up of a device, or between mode or frequency band switching. In addition, by detecting switch bounce, the time for closing the switch is reduced and reliability of the switch is improved.

Figure 1:
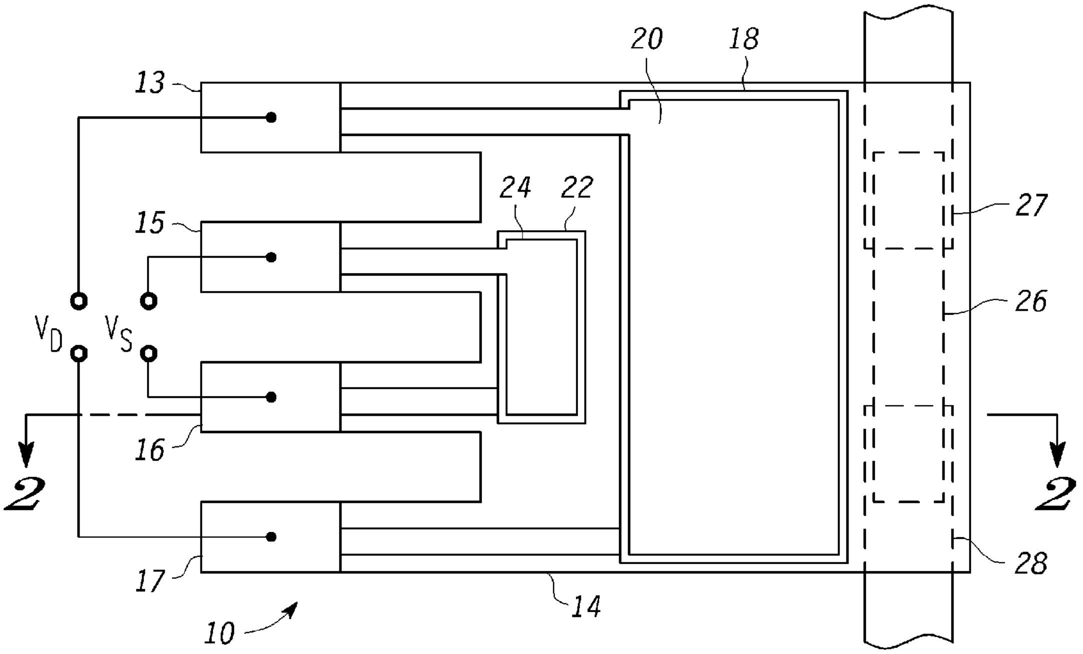
FIG. 1 illustrates a top plan view of a MEMS switch in accordance with one embodiment.
Figure 2:
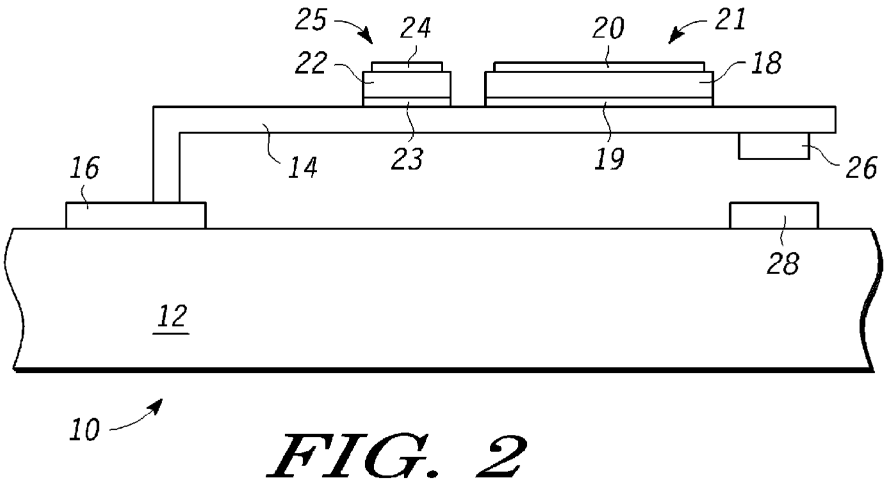
FIG. 2 illustrates a cross-sectional view taken along the line 2-2 of a portion of the switch of FIG. 1 with the contacts open.
Figure 3:
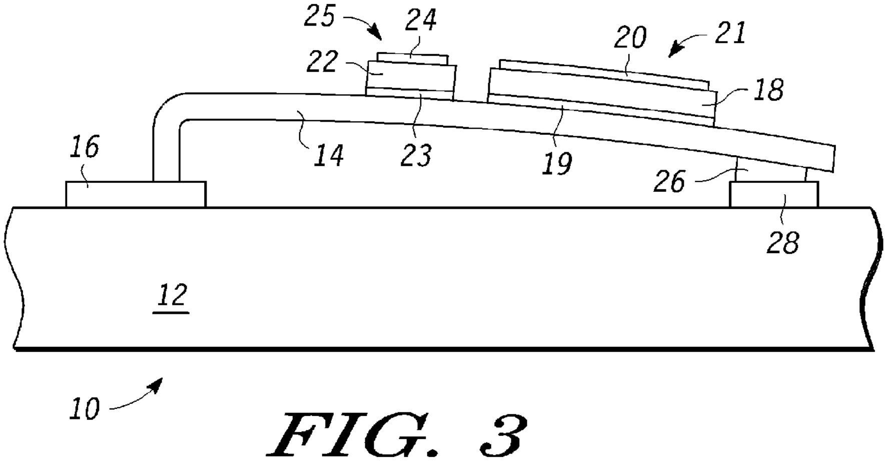
FIG. 3 illustrates a cross-sectional view taken along the line 2-2 of the switch of FIG. 2 with the contacts closed.

FIG. 1 illustrates a top plan view of a MEMS switch 10 in accordance with one embodiment. Cross-sectional views of switch 10, taken along line 2-2 in FIG. 1, are illustrated in FIG. 2 and FIG. 3. In FIG. 2 switch 10 is illustrated with contacts 26 and 28 open, and in FIG. 3 switch 10 is illustrated with contacts 26 and 28 closed.

Referring to FIGS. 1-3, switch 10 is an example of a cantilever type switch and is formed using conventional MEMS manufacturing techniques on a substrate 12. Switch 10 includes a movable portion 14, a piezoelectric activation element 21, a piezoelectric sensing element 25, a first electrical contact, or shorting bar, 26 and second electrical contacts 27 and 28. The piezoelectric activation element 21 includes a piezoelectric material 18 formed between a top electrode 20 and a bottom electrode 19. The piezoelectric sensing element 25 includes a piezoelectric material 22 formed between a top electrode 24 and a bottom electrode 23. The substrate 12 is a silicon semiconductor substrate in the illustrated embodiment but in other embodiments the substrate 12 may be formed from, for example, Gallium Arsenide, ceramics, or glass. Movable portion 14 is a cantilever beam having one end attached to a support structure and the other end positioned above the substrate 12. The cantilever beam may include a hinge or flexible portion to allow the shorting bar 26 to move down and make physical contact with electrical contacts 27 and 28 as illustrated in FIG. 3. Electrical contacts 13 and 17 receive a driver voltage labeled "VD" for activating piezoelectric activation element 21. A conductive strip is illustrated in FIG. 1 between electrical contact 13 and top electrode 20. Likewise, a conductive strip is coupled between electrical contact 17 and bottom electrode 19. When driver voltage $V_D$ is applied to electrical contacts 13 and 17, a stress is generated in piezoelectric material 18 causing the movable portion 14 to bend or flex, thus resulting in the shorting bar 26 making an electrical connection with electrical contacts 27 and 28. When driver voltage $V_D$ is removed, movable portion 14 returns to the open position as illustrated in FIG. 2. Electrical conductors (not shown) are be connected to contacts 27 and 28 in an electrical or electronic circuit for transmitting, for example, an RF signal between a transmitter and an antenna or a receiver and an antenna. In other embodiments, different types of signals may be conducted. Note that in another embodiment, the piezoelectric electrode 18 may be replaced with electrodes to electrostatically open and close switch 10, as illustrated below in FIG. 6.

Piezoelectric sensing element 25 is positioned on movable portion 14 to sense movement, or bending, of movable portion 14. In accordance with generally known piezoelectric characteristics, piezoelectric sensing element 25 generates a voltage in response to a mechanical stress such as flexing or bending. Preferably piezoelectric sensing element 25 is formed using lead zirconate titanate (PZT), but may be formed using other materials having piezo properties. A conductive strip is used to couple top electrode 24 to electrical contact 15. Likewise, a conductive strip is used to couple bottom electrode 23 to electrical contact 16. Note that the conductive strip is not illustrated in FIG. 2 or FIG. 3. Electrical contacts 15 and 16 receive a voltage from piezoelectric sensing element 22 labeled "$V_S$" in response to the flexing or bending of piezoelectric sensing element 25.

When movable portion 14 is moved in response to the application of driver voltage $V_D$, piezoelectric sensing element 25 generates voltage $V_S$. In one embodiment, the generated voltage $V_S$ is used to detect whether switch 10 is open or closed. Detection of whether switch 10 is opened or closed can be used, for example, to determine if switch 10 has failed in the field, and allow measures to be taken to protect sensitive and expensive circuitry. Also, failure detection of switch 10 can be used, for example, during manufacturing testing to improve yields.

When movable portion 14 moves to the closed position, or make electrical contact between shorting bar 26 and contacts 27 and 28, the movable portion 14 may "bounce" several times between open and closed positions before the switch completely closes. These closing transients may result in increased closing time and can reduce reliability of switch 10. The piezoelectric sensing element 25 can be used to sense the switch bouncing and to provide active damping to reduce bouncing as will be discussed later.

Figure 4:
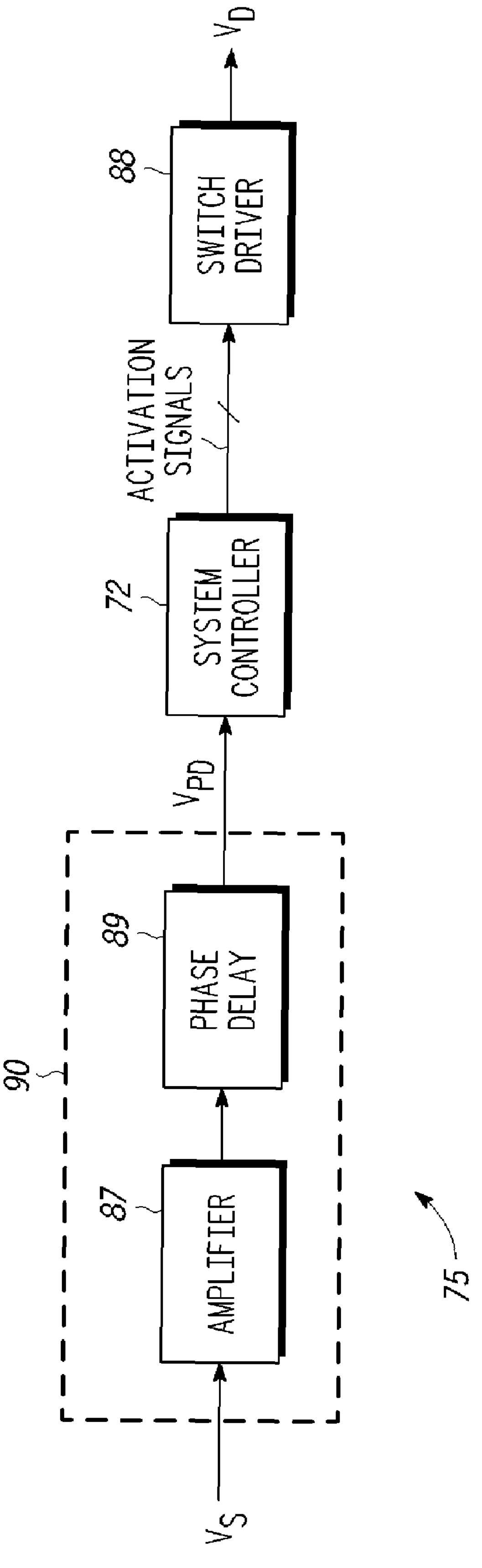
FIG. 4 illustrates, in block diagram form, an embodiment of a circuit for controlling the switch of FIG. 1.

FIG. 4 illustrates, in block diagram form, a switch bounce control circuit 75 for controlling switch 10 of FIG. 1. Circuit 75 provides active damping for reducing closing transients of switch 10 and includes switch status detection and feedback signal generator circuit 90, system controller 72, and switch driver 88. Switch status detection and feedback signal generator circuit 90 includes amplifier 87 and phase delay circuit 89. Note that switch status detection and feedback signal generator circuit 90 may also include additional circuits not illustrated in FIG. 4. Amplifier 87 has an input for receiving voltage $V_S$ from piezoelectric sensing element 22 (FIG. 1), and an output for providing an amplified version of the relatively small voltage $V_S$. Phase delay circuit 89 has an input coupled to the output of amplifier 87, and an output for providing a phase delayed output labeled "$V_{PD}$". System controller 72 has an input coupled to the output of phase delay circuit 89, and an output labeled "ACTIVATION SIGNALS". Switch driver 88 has an input coupled to the output of system controller 72, and an output for providing driver voltage $V_D$. Note that system controller 72 and switch status detection and feedback signal generator circuit 90 will receive and provide other signals not illustrated in FIG. 4.

Circuit 75 provides a negative feedback switch bouncing control system for reducing closing transients of switch 10. The relatively small voltage $V_S$ is provided each time movable portion 14 bounces. Because voltage $V_S$ from sensing element 25 has the same frequency as the bouncing frequency, a predetermined phase delay is added by phase delay 89 to produce a phase delayed signal $V_{PD}$. System controller 72 provides activation signals for controlling the opening and closing of switch 10. In accordance with the illustrated embodiment, the system controller 72 combines the phase delayed activation $V_{PD}$ with the opening and closing activation signals in a negative feedback arrangement to provide timed activations signals to counter the bounces. The timed activation signals are provided to switch driver 88. Switch driver 88 provides driver voltage $V_D$ to piezoelectric electrode 18 in response to the timed activation signals.

Figure 5:
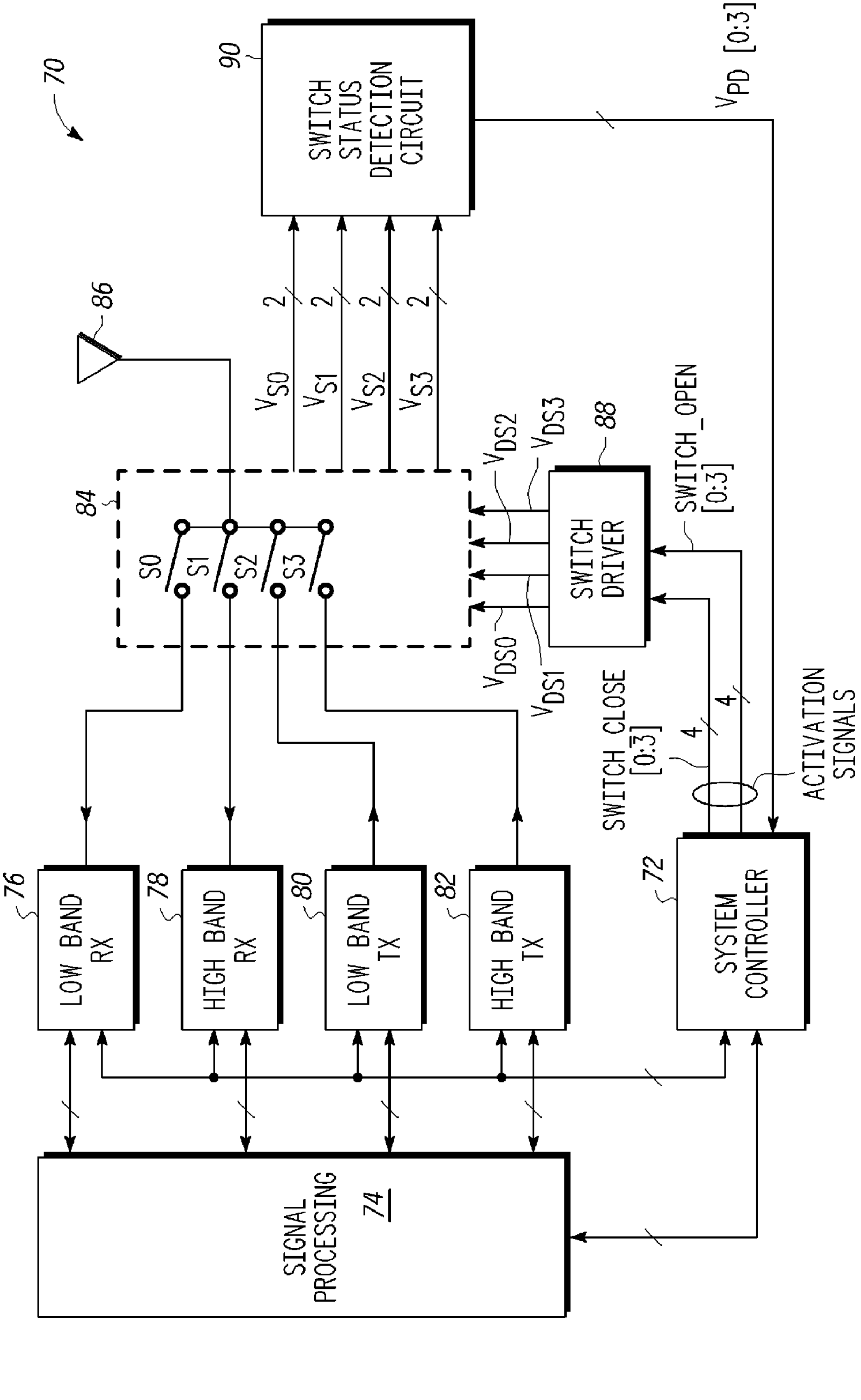
FIG. 5 illustrates, in block diagram form, a communications system implementing the circuit of FIG. 4.

FIG. 5 illustrates, in block diagram form, a communications system 70 implementing the bounce control circuit of FIG. 4. Communications system 70 is a simplified embodiment of a multi-band RF transceiver, such as for example, an RF transceiver for use in a multi-band cellular telephone handset. In another embodiment, communications system 70 may include a single-band transceiver. Communications system 70 includes system controller 72, signal processor 74, low band RF receiver circuit 76, high band RF receiver circuit 78, low band RF transmitter 80, high band RF transmitter 82, multiple-tap switch 84, antenna 86, switch driver 88, and switch status detection and feedback signal generator circuit 90.

System controller 72 controls and coordinates the operation of signal processor 74, receivers 76 and 78, transmitters 80 and 82, and switch driver 88. System controller 72 is bi-directionally coupled to processor 74, receivers 76 and 78, and transmitters 80 and 82 for sending and receiving control information. System controller 72 also has an output coupled to an input of switch driver circuit 88 for providing a plurality of control signals labeled "SWITCH CLOSE [0:3]", an output coupled to an input of switch driver circuit 88 for providing a plurality of control signals labeled "SWITCH OPEN [0:3]", and an input for receiving a control signal from switch status detection and feedback signal generator circuit 90 labeled "$V_{PD}$[0:3]".

Processor 74 primarily processes data signals that are received from receivers 76 and 78, and prepares data for transmission by transmitters 80 and 82. Processor 74 is bi-directionally coupled to receivers 76 and 78 for receiving the data and for sending and receiving control information. Likewise, processor 74 is bi-directionally coupled to transmitters 80 and 82 for sending the data and for sending and receiving control information.

Multiple-tap switch 84 includes 4 MEMS piezoelectric switches labeled "S0" through "S3". Each of the MEMS switches of multiple-tap switch 84 are functionally similar to switch 10 illustrated in FIG. 1 and discussed above. However, in other embodiments, multiple-tap switch 84 may include a different type of MEMS switch. For example, switch 11, illustrated in FIG. 6-8 and discussed below can be used in communication system 70. Also, the number of MEMS switches may be different in another embodiment. One terminal of each of the switches S0-S3 is coupled together and to antenna 86, and the other terminal is coupled to one of the transmitters or receivers as illustrated in FIG. 5. In the illustrated embodiment, only one of switches S0-S3 is closed at one time. Switch driver 88 is coupled to multiple-tap switch 84 and provides driver voltages labeled "$V_{DS0}$", "$V_{DS1}$", "$V_{DS2}$", and "$V_{DS3}$" to control activation of each of the switches S0-S3 in response to a corresponding SWITCH OPEN [0:3] or SWITCH CLOSE [0:3] activation signal from system controller 72. Switch status detection and feedback signal generator circuit 90 includes a plurality of inputs labeled "$V_{S0}$" through "$V_{S3}$" for receiving the sensed voltage for each of the piezoelectric sensing elements of switches S0 to S3. For example, the piezoelectric sensing element of switch S0 provides the sensed voltage $V_{S0}$. When a switch is detected as open or closed, the information is provided to system controller 72 as a corresponding one of signals $V_{PD}$ [0:3]. Switch status detection and feedback signal generator circuit 90 is similar to switch status detection and feedback signal generator circuit 90 of FIG. 4 except that switch status detection and feedback signal generator circuit 90 includes an amplifier and phase delay circuit similar to amplifier 87 and phase delay circuit 89 for each switch in multiple-tap switch 84. Also, switch status detection and feedback signal generator circuit 90 may include additional logic and buffer circuits (not shown).

To increase switch life, "cold switching" is used by communications system 70. That is, RF power is only turned on after the switch is closed and before the switch is opened. Cold switching can reduce switch failure due to stiction caused by arcing between the contacts. By way of example, during normal operation of communication system 70, communication system 70 is receiving low band information from antenna 86. Switch S0 is closed, coupling the antenna 86 to low band receiver 76. The other switches S1-S3 are open. If communication system 70 is required to transmit information using low band transmitter 80, system controller 72 will first assert control signal SWITCH OPEN 0 to cause switch S0 to open. Switch status detection and feedback signal generator circuit 90 will detect if switch S0 actually opened, and if switch S0 opened, will assert the appropriate one of signals $V_{PD}$[0:3] to system controller 72. System controller 72 can then assert control signal SWITCH CLOSE 2 to direct switch driver 88 to provide drive voltage $V_{DS2}$ to cause switch S2 to close, thus connecting low band transmitter 80 to antenna 86. As described above in the discussion of FIG. 4, the piezoelectric sensing element of the switch being closed will sense if the closing switch bounces, and provide a phase delayed negative feedback signal to system controller 72. System controller 72 will then apply activation pulses to prevent, or reduce, the bounce. Once the switch is sensed to be closed, RF power is then turned on by system controller 72 and low band transmitter 80 will transmit an RF signal to antenna 86.

Figure 6:
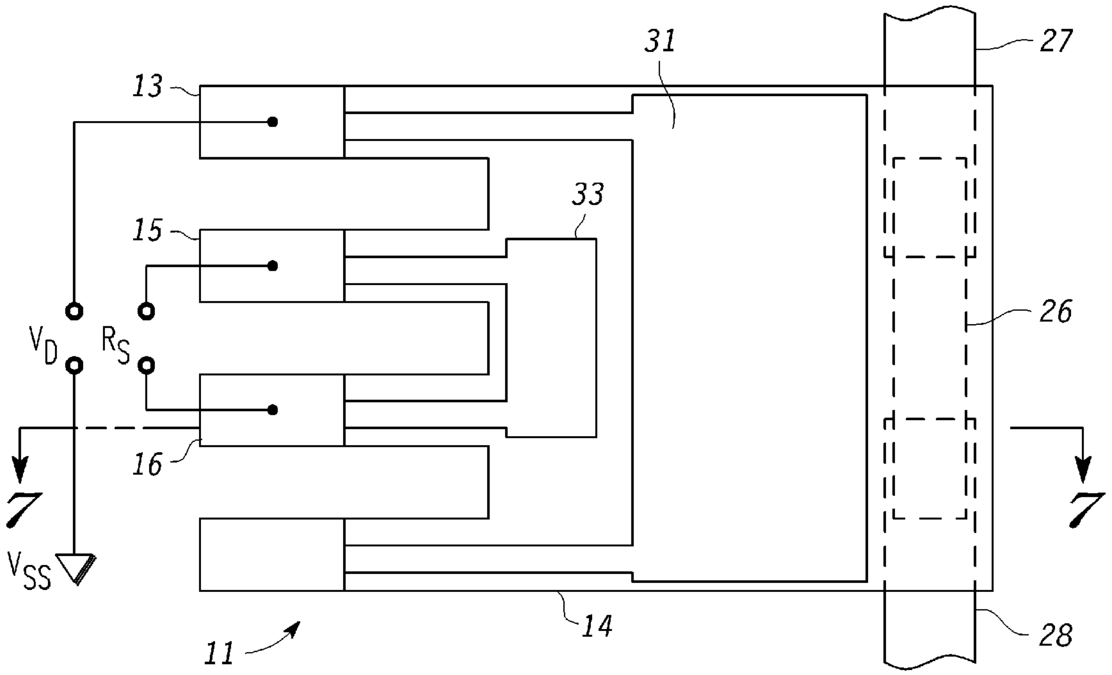
FIG. 6 illustrates a top plan view of a MEMS switch in accordance with another embodiment.
Figure 7:
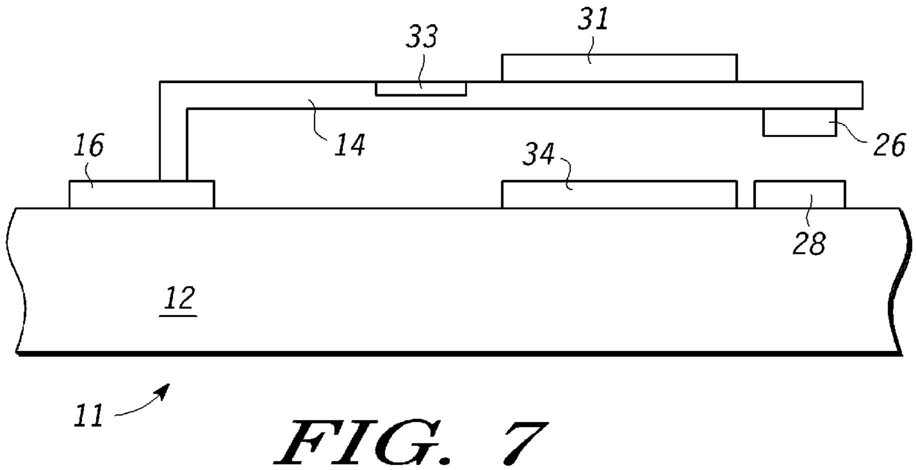
FIG. 7 illustrates a cross-sectional view taken along the line 7-7 of a portion of the switch of FIG. 6 with the contacts open.
Figure 8:
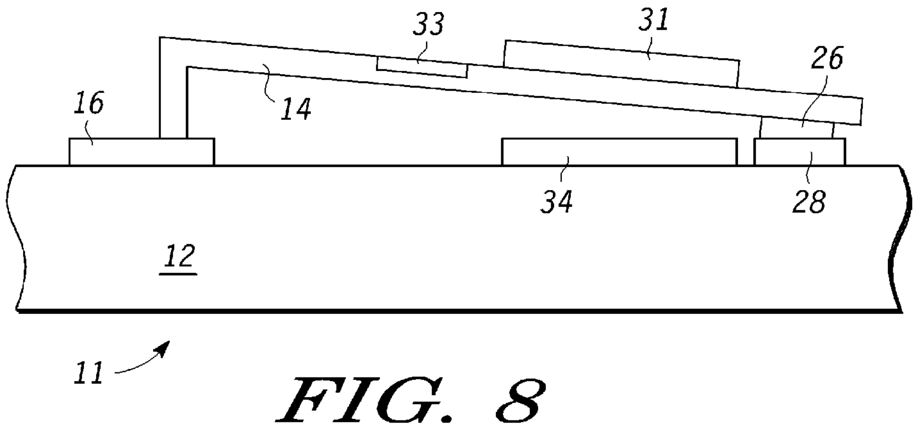
FIG. 8 illustrates a cross-sectional view taken along the line 7-7 of the switch of FIG. 6 with the contacts closed.

FIG. 6 illustrates a top plan view of a MEMS switch 11 in accordance with another embodiment. Cross-sectional views of switch 11, taken along line 7-7 in FIG. 6, are illustrated in FIG. 7 and FIG. 8. In FIG. 7 switch 11 is illustrated with contacts 26 and 28 open, and in FIG. 8 switch 11 is illustrated with contacts 26 and 28 closed.

Referring to FIGS. 6-8, switch 11 is a cantilever type switch and is formed using conventional MEMS manufacturing techniques on a substrate 12. Switch 11 includes a movable portion 14, a bottom activation electrode 34, a top activation electrode 31, a piezo-resistive sensing element 33, a first electrical contact, or shorting bar, 26 and second electrical contacts 27 and 28. The substrate 12 is a silicon substrate in the illustrated embodiment but in other embodiments the substrate 12 may be formed from, for example, Gallium Arsenide, ceramics, or glass. Movable portion 14 is a cantilever beam having one end attached to a support structure and the other end positioned above the substrate 12. The cantilever beam may include a hinge or flexible portion to allow the shorting bar 26 to move down and make physical contact with electrical contacts 27 and 28 as illustrated in FIG. 8. Electrical contact 13 receives a driver voltage labeled "$V_D$" for activating top activation electrode 31. When driver voltage $V_D$ is applied, the top activation electrode 31 and the bottom activation electrode 34 function to electrostatically close the switch causing contact 26 to make an electrical connection with contacts 27 and 28. When driver voltage $V_D$ is removed, the movable portion 14 returns to the open position as illustrated in FIG. 7. Electrical conductors (not shown) are connected to contacts 27 and 28 in an electrical or electronic circuit for transmitting, for example, an RF signal between a transmitter and an antenna or a receiver and an antenna when switch 11 is closed. Note that in another embodiment, the top and bottom activation electrodes may be replaced with a piezoelectric activation electrode as discussed above regarding FIG. 1.

Piezo-resistive sensing element 33 is positioned on movable portion 14 to sense movement of movable portion 14. Note that even though only one piezo-resistive sensing element 33 is illustrated on movable portion 14, in other embodiments, more than one may be used. In accordance with generally known piezo-resistive characteristics, a resistance of piezo-resistive sensing element 33 will change in response to being flexed, or bent. Piezo-resistive sensing element 33 is implemented in the silicon of movable portion 14, and is preferably fabricated as a bridge circuit for improved accuracy and sensitivity. Preferably piezo-resistive element 33 is formed using silicon or thin film polysilicon. In another embodiment, piezo-resistive element 33 may be formed using a different piezo-resistive material. As illustrated in FIG. 1, piezo-resistive sensing element 33 is electrically coupled to contacts 15 and 16 using conductive strips to provide a resistance value labeled "$R_S$" that changes in response to being flexed. Note that the conductive strips are not illustrated in FIG. 7 or FIG. 8.

The changing resistance value $R_S$ is used to detect whether switch 11 is open or closed. Detection of whether switch 11 is open or closed can be used, for example, to detect if switch 11 has failed in the field and allow sensitive and expensive circuitry to be isolated before damage can occur. Also, failure detection of switch 11 can be used, for example, during manufacturing testing to improve yields.

As discussed above, when movable portion 14 moves to close, or make electrical contact between shorting bar 26 and contacts 27 and 28, the movable portion 14 may "bounce" several times between the open and closed positions before the switch completely closes. These closing transients may result in increased closing time and can reduce the reliability of switch 11. The piezo-resistive sensing element 33 can be used to sense the switch bouncing and to provide active damping to reduce bouncing as discussed above regarding FIG. 4.

Figure 9:
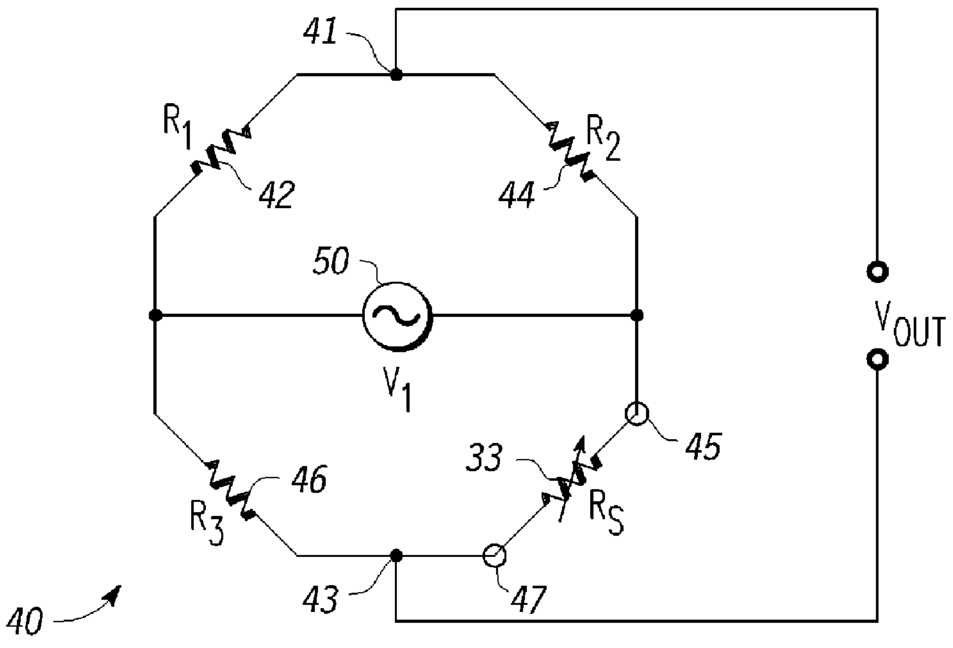
FIG. 9 illustrates, in schematic diagram form, a detection circuit for use with the switch of FIG. 6 in accordance with one embodiment.

FIG. 9 illustrates, in schematic diagram form, a detection circuit 40 for use with the switch of FIG. 6 in accordance with one embodiment. Detection circuit 40 is used to determine if a MEMS switch such as switch 11 is open or closed. Detection circuit 40 includes resistors 42, 44, and 46, and signal source 50. Resistor 42 has a first terminal coupled to a first output terminal 41, and a second terminal. Resistor 44 has a first terminal coupled to the first terminal of resistor 42, and a second terminal coupled to sensing electrode terminal 45. Resistor 46 has a first terminal coupled to the second terminal of the resistor 42, and a second terminal coupled to both second output terminal 43 and to sensing electrode terminal 47. Signal source 50 has a first output terminal coupled to the second terminal of resistor 42, and a second output terminal coupled to the second terminal of the resistor 44. Signal source 50 provides a time varying, or AC signal labeled "$V_1$". In the illustrated embodiment, $V_1$ is time-varying voltage such as a sine wave. In another embodiment, the signal $V_1$ may be a DC voltage. Resistor 42 has a resistance value labeled "$R_1$", resistor 44 has a resistance value labeled "$R_2$", and resistor 46 has a resistance value labeled "$R_3$". The first and second output terminals provide a voltage labeled "$V_{OUT}$". Piezo-resistive sensing element 33 is coupled to terminals 45 and 47. In detection circuit 40, the resistance values of resistors 42, 44, and 46 are chosen so that when the switch is open $$R_1/R_2=R_3/R_S \text{ and } V_{OUT}=0.$$

When switch 11 closes, $R_S$ becomes larger; the ratio value $R_3/R_S$ changes, causing $V_{OUT}$ to be non-zero.

In the illustrated embodiment, detection circuit 40 is preferably implemented on the same substrate as switch 11 as a part of switch status detection and feedback signal generator circuit 90 (illustrated in FIG. 4 and FIG. 5). This minimizes undesirable parasitic effects from, for example, long conductors such as wire bonds and board traces. However, in other embodiments detection circuit 40 may be implemented on another substrate.

Figure 10:
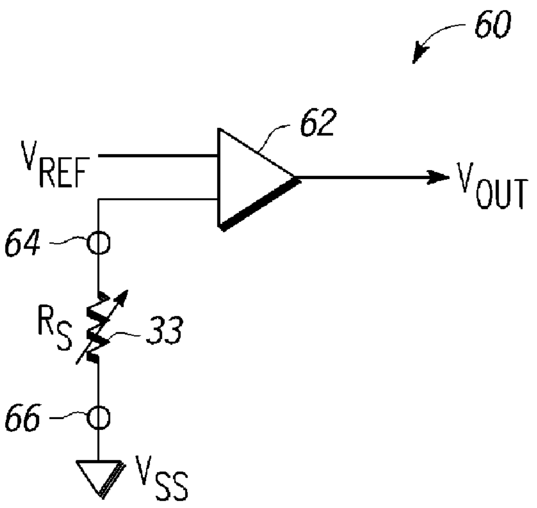
FIG. 10 illustrates, in schematic diagram form, a detection circuit for use with the switch of FIG. 6 in accordance with another embodiment.

FIG. 10 illustrates, in schematic diagram form, a detection circuit 60 for use with the switch of FIG. 6 in accordance with another embodiment. Detection circuit 60 may be used in, for example, switch status detection and feedback signal generator circuit 90 of FIG. 4 and FIG. 5. Detection circuit 60 includes amplifier 62. Amplifier 62 has a first input for receiving a reference voltage labeled "$V_{REF}$", a second input coupled to a terminal 64, and an output for providing an output voltage labeled "$V_{OUT}$". Piezo-resistive sensing element 33 is coupled between terminal 64 and terminal 66. Terminal 66 is coupled to a power supply voltage terminal labeled "$V_{SS}$". In the illustrated embodiment, $V_{SS}$ is coupled to ground. In another embodiment, $V_{SS}$ may be a different power supply voltage. When switch 11 opens and closes the resistance value $R_S$ changes between a low resistance value and a higher resistance value. A corresponding low and high voltage change is provided to the second input of amplifier 62. The reference voltage $V_{REF}$ is chosen to be between the high and low voltage provided at the second input of amplifier 62. Amplifier 62 compares the voltage at terminal 64 to $V_{REF}$, the voltage $V_{OUT}$ is determined as a result of the comparison. For example, if the voltage at terminal 64 is higher than $V_{REF}$, then $V_{OUT}$ may correspond to a logic one indicating that switch 30 is closed. If the voltage at terminal 64 is lower than $V_{REF}$, then $V_{OUT}$ may correspond to a logic zero, indicating that switch 30 is open.

Like detection circuit 40, detection circuit 60 is preferably implemented on the same substrate as switch 30. This minimizes undesirable parasitic effects from, for example, long conductors such as wire bonds and board traces. However, in other embodiments detection circuit 60 may be implemented on another substrate.

Figure 11:
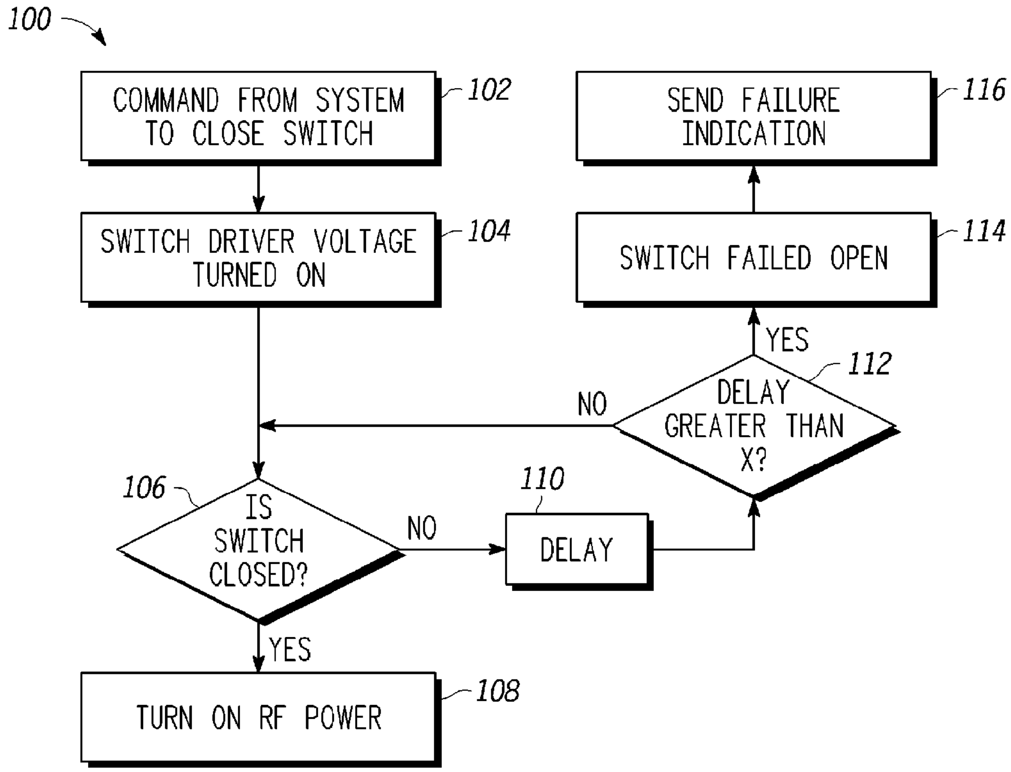
FIG. 11 is a flow chart for illustrating a method to close a MEMS switch in accordance with an embodiment of the disclosure.

FIG. 11 is a flow chart for illustrating a method 100 for closing a MEMS switch in a system in accordance with one embodiment. At step 102, a command to close a switch is provided by a system controller, such as system controller 72 (FIG. 5). At step 104, the command is received by a switch driver circuit, such as switch driver circuit 88. The switch driver provides a drive voltage $V_D$ to close the switch. At decision step 106, it is determined if the switch is closed. If the detection circuit, such as detection and feedback signal generator circuit 90, determines that the switch closed, then the YES path is taken to step 108 and RF power is turned on and transmitted through the switch. However, if the switch did not close, the NO path is taken to step 110 where an incremental delay is applied. After the incremental delay at decision step 112, it is determined if the total accumulated delay is greater than a predetermined delay period "X". The delay X may be a predetermined multiple of the incremental step 110 delay. If at decision step 112 the accumulated total delay is less than the predetermined delay X, the detection circuit checks the status of the switch by looping around the NO path from decision step 112 to decision step 106 and back to decision step 112. The incremental delay at step 110 is added to the total delay at step 112. If the switch closes before the end of the predetermined delay X, then the YES path is taken from step 106 to step 108 and RF power is turned on. However, if the switch fails to close before the end of the predetermined delay X, the YES path is taken from decision step 112 to step 114. At step 114, the switch is determined to be failed open, and at decision step 116, a failure indication is sent from the detection circuit to the system controller.

Figure 12:
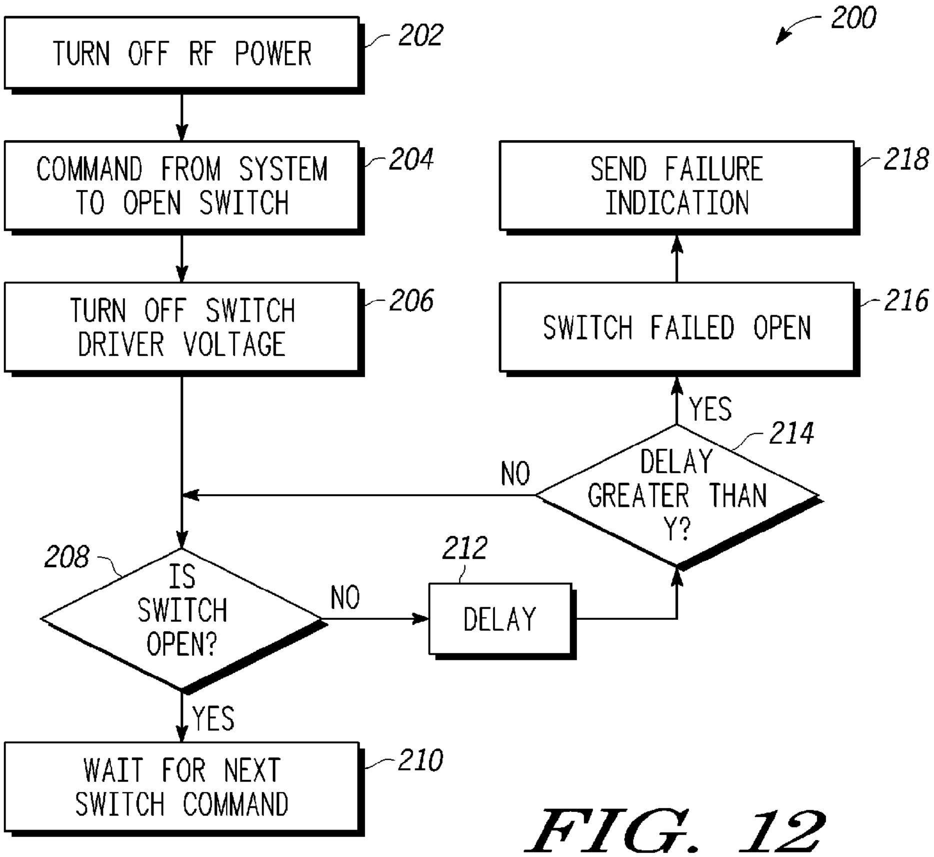
FIG. 12 is a flow chart for illustrating a method to open a MEMS switch in accordance with an embodiment of the disclosure.

FIG. 12 is a flow chart for illustrating a method 200 to open a MEMS switch in accordance with an embodiment of the disclosure. At step 202 the RF power is first turned off if it is desirable to "cold switch" the MEMS switch. At step 204, a command to open a switch is provided by the system controller to the switch driver. At step 206, the switch driver then turns off the driver voltage that holds the switch closed, allowing the switch to open. At decision step 208, the detection circuit, such as detection circuit 40, determines if the switch is open. If the switch is open, the YES path is taken from step 208 to step 210, and the switch driver circuit and detection circuit wait until the next switch activation command. However, if at step 208 it is determined that the switch is still closed, the NO path is taken from step 208 to delay step 212. As discussed above regarding the method 100 of FIG. 11, the step 212 delay is an incremental delay that is accumulated to provide an accumulated delay. At decision step 214, it is determined if the accumulated delay is greater than a predetermined delay "Y". If the delay is less than the delay Y, the NO path is taken back to step 208. If the switch is detected as open, then the YES path is taken from step 208 to step 210. If the switch is still detected as closed, the method loops around delay step 212, decision step 214, and decision step 208 until the accumulated delay is greater than delay Y. If the accumulated delay is greater than delay Y then the YES path is taken from step 214 to step 216. At step 216 the switch is determined to have failed open and a failure indication is sent at step 218.

Figure 13:
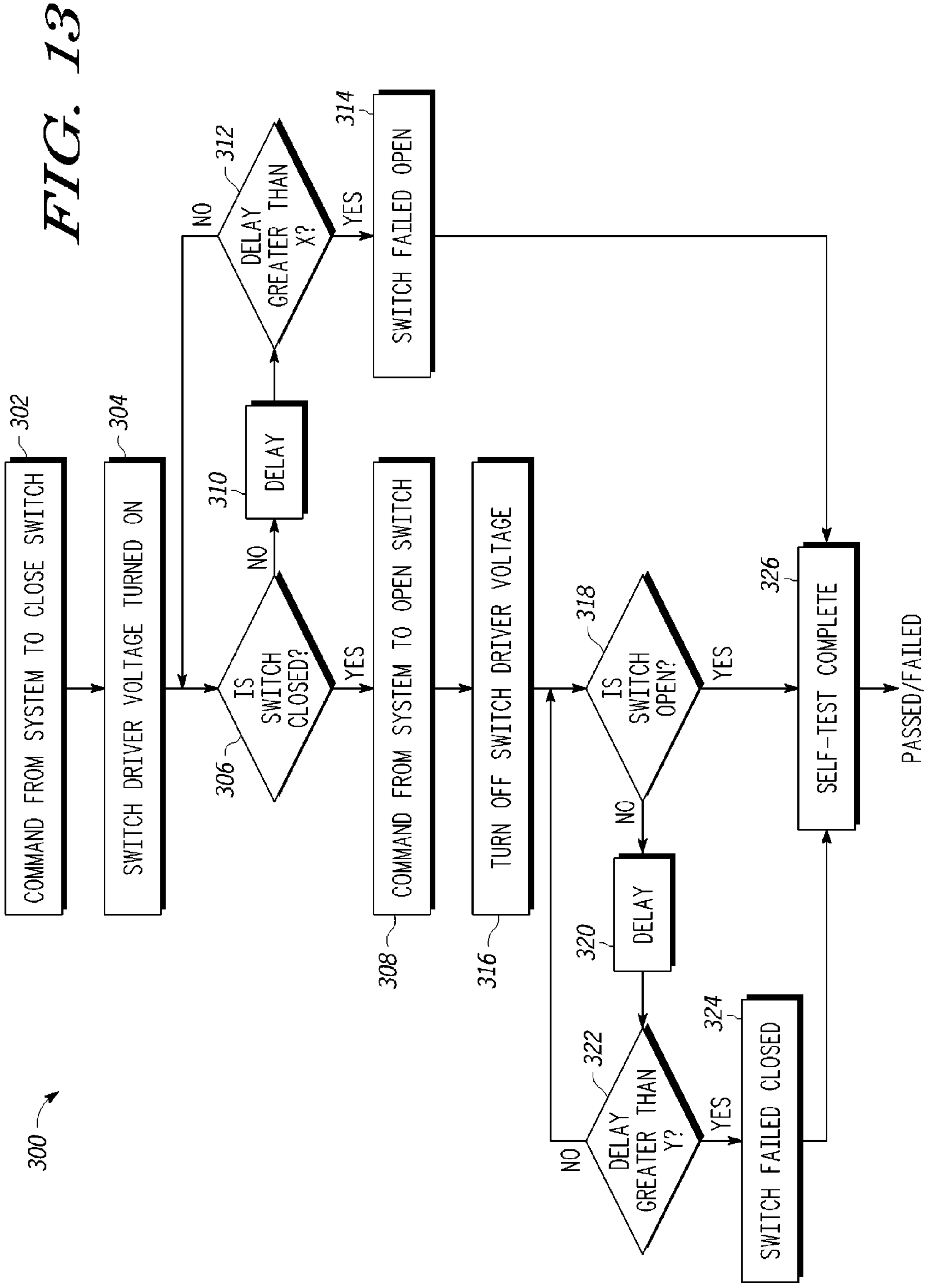
FIG. 13 is a flow chart for illustrating a method to test a MEMS switch in accordance with an embodiment of the disclosure.

FIG. 13 is a flow chart for illustrating a method 300 to test a MEMS switch at, for example, power up, during mode switching, or during manufacturing. At step 302 a command to close a switch is provided by a system controller, such as system controller 72. At step 304, the command is received by a switch driver circuit, such as switch driver circuit 88. The switch driver provides a drive voltage to close the switch. At decision step 306, it is determined if the switch is closed. If the detection circuit, such as detection and feedback signal generator circuit 90, determines that the switch closed, then the YES path is taken to step 308. If at step 306 it is determined that the switch is closed, the NO path is taken to step 310 and an incremental delay is applied to an accumulated delay. At step 312, it is determined if the accumulated delay is greater than a predetermined delay X. If the accumulated delay is less than delay X, the method loop around steps 306, 310, and 312 until either the switch is detected to be closed, or the delay is determined to be greater than delay X at step 312. If the delay is greater than delay X and the switch is still open, the YES path is taken from step 312 to step 314. At step 314 the switch is determined to have failed. A step 326, the self-test is complete and a negative pass/fail indication is provided.

Referring back to step 306, if the switch is determined to have closed, the YES path is taken to step 308 and a command is provided by the system controller to open the switch. At step 316, the switch driver circuit turns off the driver voltage to the activation electrodes of the switch and the switch is suppose to open. At decision step 318, it is determined if the switch opened. If the switch opened the YES path is taken from step 318 to step 326 and the passed indication is provided. If the switch is not detected as opened, the NO path is taken to step 320 and an incremental delay is applied to an accumulated delay. At step 322 it is determined if the accumulated delay is greater than a delay Y. If the accumulated delay is not greater than delay Y, then the NO path is taken to step 318. Step 318 is repeated via the loop around steps 320 and 322 until the accumulated delay is greater than delay Y. If the accumulated delay is greater than delay Y, the YES path is taken from step 322 to step 324 and the switch is determined to have failed closed. At step 326 a failed indication is provided.

The described embodiments provide a detection circuit and method for detecting if a piezoelectric MEMS switch is closed or open. The use of the detection circuit allows for reliable "cold switching" of RF power. Also, the detection circuit and method provides for self-test functionality that can increase the reliability of a system having the detection circuit. In addition, the piezoelectric sensing element can be used in a circuit to detect and reduce switch bounce.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. The terms a or an, as used herein, are defined as one or more than one. The terms including and/or having, as used herein, are defined as comprising (i.e., open language). As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A micro electromechanical device comprising:

a micro electromechanical switch having a movable portion positioned to form an electrical connection between a first electrical contact and a second electrical contact, an electrode formed on the movable portion, the electrode for causing the movable portion to move in response to a driver voltage;

a piezo-resistive element, formed on the movable portion, for detecting movement of the movable portion between an open position and a closed position; and a detection circuit, comprising:

a first resistor having a first terminal coupled to a first output terminal, and a second terminal;

a second resistor having a first terminal coupled to the first terminal of the first resistor, and a second terminal coupled to a first terminal of the piezo-resistive element;

a third resistor having a first terminal coupled to the second terminal of the first resistor, and a second terminal coupled to both a second output terminal and to a second terminal of the piezo-resistive element; and a signal source having a first output terminal coupled to the second terminal of the first resistor, and a second output terminal coupled to the second terminal of the second resistor.

2. The device of claim 1, wherein the piezo element provides a first output voltage when the movable portion is in the open position and provides a second output voltage when the movable portion is in the closed position.

3. The device of claim 1, wherein the piezo element is characterized as being a piezoelectric element that generates a voltage in response to a mechanical stress caused by movement of the movable portion.

4. The device of claim 1, wherein the piezo-resistive element changes resistance in response to a mechanical stress caused by movement of the movable portion.

5. The device of claim 4, further comprising a detection circuit, the detection circuit comprising an amplifier having a first input terminal for receiving a reference voltage, a second input terminal coupled to the piezo-resistive element, and an output terminal for providing a first output voltage when the movable portion is in the open position and for providing a second output voltage when the movable portion is in the closed position.

6. The device of claim 1, further comprising a switch bounce control circuit for reducing switch bounce when the movable portion is transitioning from the open position to the closed position.

7. The device of claim 6, wherein the switch bounce control circuit comprises:

an amplifier, coupled to the piezo element, for providing an amplified signal in response to the piezo element detecting bouncing of the movable portion;

a phase delay circuit coupled to receive the amplified signal, and in response, providing a phase delayed amplified signal;

a switch controller coupled to receive the phase delayed amplified signal, and to provide a switch activation signal to counter the bouncing of the movable portion; and a switch driver circuit coupled to receive the switch activation signal, and in response, provide the driver voltage to the electrode.

8. The device of claim 1, wherein the electromechanical switch and the piezo element are implemented on a semiconductor substrate.

9. The device of claim 1, wherein the electrode is a piezoelectric electrode.

10. A micro electromechanical device comprising:

a micro electromechanical switch having a movable portion positioned to form an electrical connection between a first electrical contact and a second electrical contact, an electrode formed on the movable portion, the electrode for causing the movable portion to move in response to a driver voltage;

a piezo-resistive element, formed on the movable portion, for detecting movement of the movable portion between an open position and a closed position; and a detection circuit, comprising an amplifier having a first input terminal for receiving a reference voltage, a second input terminal coupled to the piezo-resistive element, and an output terminal for providing a first output voltage when the movable portion is in the open position and for providing a second output voltage when the movable portion is in the closed position.

11. The device of claim 10, further comprising a switch bounce control circuit for reducing switch bounce when the movable portion is transitioning from the open position to the closed position.

12. The device of claim 11, wherein the switch bounce control circuit comprises:

an amplifier, coupled to the piezo element, for providing an amplified signal in response to the piezo element detecting bouncing of the movable portion;

a phase delay circuit coupled to receive the amplified signal, and in response, providing a phase delayed amplified signal;

a switch controller coupled to receive the phase delayed amplified signal, and to provide a switch activation signal to counter the bouncing of the movable portion; and a switch driver circuit coupled to receive the switch activation signal, and in response, provide the driver voltage to the electrode.

13. The device of claim 10, wherein the electromechanical switch and the piezo element are implemented on a semiconductor substrate.

14. The device of claim 10, wherein the electrode is a piezoelectric electrode.

15. A micro electromechanical device comprising:

a micro electromechanical switch having a movable portion positioned to form an electrical connection between a first electrical contact and a second electrical contact, an electrode formed on the movable portion, the electrode for causing the movable portion to move in response to a driver voltage;

a piezo element, formed on the movable portion, for detecting movement of the movable portion between an open position and a closed position; and a switch bounce control circuit for reducing switch bounce when the movable portion is transitioning from the open position to the closed position, the switch bounce control circuit comprising:

an amplifier, coupled to the piezo element, for providing an amplified signal in response to the piezo element detecting bouncing of the movable portion;

a phase delay circuit coupled to receive the amplified signal, and in response, providing a phase delayed amplified signal;

a switch controller coupled to receive the phase delayed amplified signal, and to provide a switch activation signal to counter the bouncing of the movable portion; and a switch driver circuit coupled to receive the switch activation signal, and in response, provide the driver voltage to the electrode.

16. The device of claim 15, wherein the piezo element provides a first output voltage when the movable portion is in the open position and provides a second output voltage when the movable portion is in the closed position.

17. The device of claim 15, wherein the piezo element is characterized as being a piezoelectric element that generates a voltage in response to a mechanical stress caused by movement of the movable portion.

18. The device of claim 15, wherein the piezo element is characterized as being a piezo-resistive element that changes resistance in response to a mechanical stress caused by movement of the movable portion.

19. The device of claim 18, further comprising a detection circuit, the detection circuit comprising:

a first resistor having a first terminal coupled to a first output terminal, and a second terminal;

a second resistor having a first terminal coupled to the first terminal of the first resistor, and a second terminal coupled to a first terminal of the piezo-resistive element;

a third resistor having a first terminal coupled to the second terminal of the first resistor, and a second terminal coupled to both a second output terminal and to a second terminal of the piezo-resistive element; and a signal source having a first output terminal coupled to the second terminal of the first resistor, and a second output terminal coupled to the second terminal of the second resistor.

20. The device of claim 18, further comprising a detection circuit, the detection circuit comprising an amplifier having a first input terminal for receiving a reference voltage, a second input terminal coupled to the piezo-resistive element, and an output terminal for providing a first output voltage when the movable portion is in the open position and for providing a second output voltage when the movable portion is in the closed position.

* * * * *